United States Patent
Rozen et al.

(10) Patent No.: US 8,901,986 B2
(45) Date of Patent: Dec. 2, 2014

(54) INTEGRATED CIRCUIT AND A METHOD OF POWER MANAGEMENT OF AN INTEGRATED CIRCUIT

(75) Inventors: Anton Rozen, Gedera (IL); Leonid Fleshel, Hertzelia (IL); Michael Priel, Hertzelia (IL)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/988,549

(22) PCT Filed: Nov. 25, 2010

(86) PCT No.: PCT/IB2010/055415
§ 371 (c)(1),
(2), (4) Date: May 21, 2013

(87) PCT Pub. No.: WO2012/069880
PCT Pub. Date: May 31, 2012

(65) Prior Publication Data
US 2013/0241606 A1   Sep. 19, 2013

(51) Int. Cl.
*H03K 5/08* (2006.01)
*H03K 17/16* (2006.01)
*G06F 1/32* (2006.01)

(52) U.S. Cl.
CPC ............. *H03K 17/16* (2013.01); *Y02B 60/32* (2013.01); *G06F 1/3287* (2013.01)
USPC ............. 327/310; 327/379; 327/530; 326/33

(58) Field of Classification Search
USPC ......... 327/310, 379, 384, 534, 535, 538, 543, 327/544, 530, 198, 142, 143; 713/320, 330, 713/340; 716/133; 361/90, 91.1, 92
See application file for complete search history.

(56) References Cited

U.S. PATENT DOCUMENTS

| | | | |
|---|---|---|---|
| 5,701,093 A * | 12/1997 | Suzuki | 326/98 |
| 7,145,383 B2 * | 12/2006 | Mizuno et al. | 327/546 |
| 7,187,205 B2 | 3/2007 | Ramaraju | |
| 7,279,927 B2 * | 10/2007 | Falkowski et al. | 326/33 |
| 2003/0226084 A1 | 12/2003 | Okada et al. | |
| 2005/0060587 A1 | 3/2005 | Hwang et al. | |
| 2006/0192596 A1 | 8/2006 | Ramaraju et al. | |
| 2009/0049321 A1 | 2/2009 | Balatsos et al. | |
| 2010/0165776 A1 * | 7/2010 | Tada | 365/226 |
| 2010/0194470 A1 * | 8/2010 | Monchiero et al. | 327/566 |
| 2011/0316616 A1 * | 12/2011 | Yoda | 327/535 |

OTHER PUBLICATIONS

International Search Report and Written Opinion correlating to PCT/IB2010/055415 dated Jun. 27, 2011.

* cited by examiner

*Primary Examiner* — Lincoln Donovan
*Assistant Examiner* — Thomas Skibinski

(57) ABSTRACT

An integrated circuit includes a plurality of power gating elements for controlling power applied to a first module which is in a powered off state, while a second module is in a powered on state, the second module being coupled to receive at least one signal from the first module when the first module is powered on. A a synchronization controller is provided for controlling the power gating elements to ramp up the power gated to the first module in order to power it up and, for a time while the power gated to the first module is below a first level, reducing the power gated to the second module, and for a time when the power gated to the first module is above the first level, increasing the power gated to the second module.

20 Claims, 2 Drawing Sheets

INTEGRATED CIRCUIT AND A METHOD OF POWER MANAGEMENT OF AN INTEGRATED CIRCUIT

FIELD OF THE INVENTION

This invention relates to an integrated circuit and a method of power management of an integrated circuit, particularly one that has different functional modules thereon, which may be independently powered up or down.

BACKGROUND OF THE INVENTION

Integrated Circuits (ICs) having a number of functional modules thereon are well known. It is often the case that different functional modules or different circuit portions may be needed at different times and may have different power requirements. In the field of mobile devices, and other applications where high performance (at least some of the time) and low power consumption are required, it is known to power down modules or circuit portions that are not expected to be needed to be used at particular times so as to reduce power usage.

Hereinafter, the term "module" will be used. However, it should be understood that this term is not intended to be limited to particularly defined functionality, but covers any part of the integrated circuit that can be powered up or down in accordance with the overall requirements of the operation of the circuit. Furthermore, as used hereinafter, the terms "powered up" and "powered down" refer to the dynamic change of state when power is applied or removed to/from particular modules, so that the modules are transitioning between "on" and "off" states. The terms "on" or "powered on" and "off" or "powered off" are used to refer to such modules that are in the steady powered up or powered down state. It should also be noted that the term "off" is not limited to only the cases where no power is supplied to the module at all, but includes cases where the power supplied is substantially reduced to a much lower level than the full power, but still is at some low level that may be needed to maintain essential functionality of the module (a "sleep" mode) that allows the module to then be powered up.

Power gating is often used to control the voltage supply to individual modules or portions of the circuit using power gates that can transfer power to the particular module or portion, or to stop such power transfer. Power gating involves inserting a gate (such as a transistor) between the power supply and the module. By turning the gate off, the power to the module can be effectively removed.

However, if the power to the module is completely shut off, then some elements in the module may lose data or, at least, a "memory" of their state prior to power shut-off. Furthermore, when modules are powered up again, spurious transient signals may occur, which may affect the states of the elements, and which may also transfer through from a first such module that is being powered up to a second module that is always on, or at least is on before, during and after the first module is powered up from off to on. It is known to provide isolation cells between different modules to suppress transfer of such transient spurious signals. Such isolation cells may sometimes include one or more memory devices for retaining knowledge of the states of the elements prior to shutting-off the power, and for re-enabling those states when the power is switched back on.

The isolation cell may be implemented within the module that is off, in the module that remains on, or even as a separate cell from either of the two modules. Such isolation cells bring additional complexity into the design of an integrated circuit, since they have to be placed with very restrictive rules into the design, having an impact on the timing of the critical path through the circuit, and therefore on circuit frequency. For example, if the isolation module is positioned within the off module, then a further power supply must be provided within the off module that is always on, so as to power the isolation cell. On the other hand, if the isolation cell is positioned within the on module, then the on module cannot be designed independently, as its design must take into account the off module.

SUMMARY OF THE INVENTION

The present invention provides a method and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
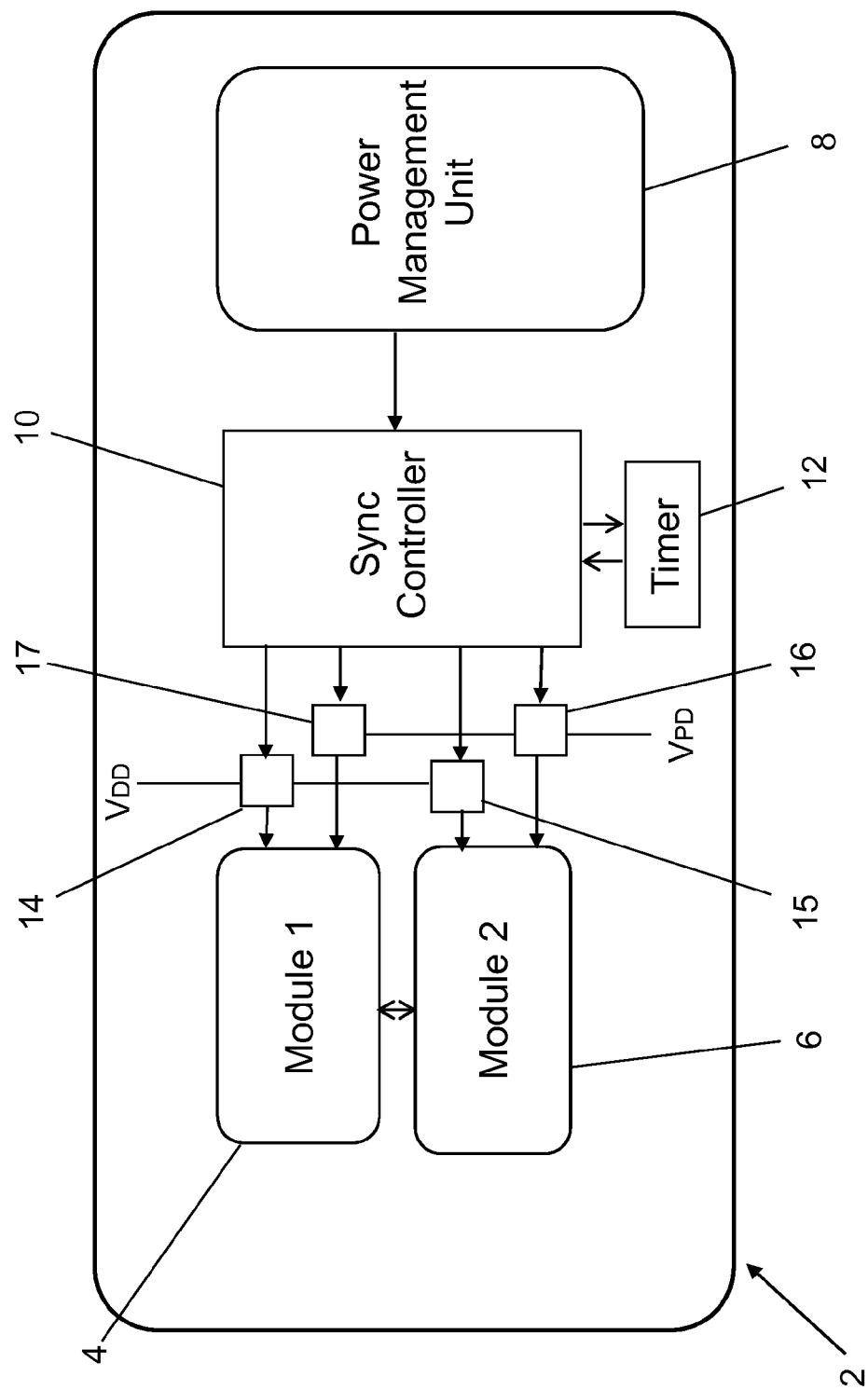
FIG. 1 schematically shows an example of an embodiment of an integrated circuit having at least two modules and a power management system.

The integrated circuit 2 shown in FIG. 1 comprises a power management system able to perform a method for power management. The shown example comprises, as explained below in more detail, a plurality of independent functional modules. When the method starts, at least a first one of the functional modules is in a powered off state, while a second one is in a powered on state. The second module is connected to the first module, and a plurality of power gating elements, each of said power gating elements are coupled between a respective functional module and a source of power for that functional module, the method comprising controlling the power gating elements to ramp up the power gated to the first module in order to power it up and, for a time while the power gated to the first module is below a first level, reducing the power gated to the second module, and for a time when the power gated to the first module is above the first level, increasing the power gated to the second module.

Thus, the power applied to both connected modules is synchronously changed, thus obviating the need for complicated isolation cells inserted between the connected modules. This, in turn, may lead to a reduction in the overall power consumption of the chip, as well as overcoming the problem of power spikes propagating through the integrated circuit. It will also be apparent that each module can therefore be designed independently of the other modules, thereby simplifying the design of the integrated circuit. Furthermore, if the module that is always on includes well biasing, then this can still be included in order to reduce current through even more.

In the shown examples, the power gating elements are controlled so that, for the time while the power gated to the first module is below the first level, the sum of the power supplied to the first and second modules is lower than potential transient power spikes. For example, the power gating elements can be controlled so that, for the time while the power gated to the first module is below the first level, the power gated to the second module is ramped down to a second level.

In the shown examples, the power gating controller controls the power gating elements so that, for at least some of the time when the power gated to the first module is above the first level, the difference between the power gated to the first module and the power gated to the second module is less than a set value. The time when the difference between the power gated to the first module and the power gated to the second module is not less than the set value is can e.g. be minimised.

In the shown examples, the method further comprises timing from when the power gated to the first module is first started to ramp up, and controlling the power gating elements so that the reduction in the power gated to the second module and the increase in the power gated to the second module occurs at set times from when the power gated to the first module is first started to ramp up. Additionally or alternatively, the method can further comprise sensing the power gated to the first module, and controlling the power gating elements so that at least one of the reduction in the power gated to the second module and the increase in the power gated to the second module is based on the sensed power.

The example shown in FIG. 1, is an integrated circuit, comprising: a plurality of functional modules, at least a first module being in a powered off state, while a second module is in a powered on state, the second module being connected to the first module; a plurality of power gating elements, each of said power gating elements being coupled between a respective functional module and a source of power for that functional module; and a power gating controller coupled to the power gating elements for controlling the power gating elements to ramp up the power gated to the first module in order to power it up and, for a time while the power gated to the first module is below a first level, reducing the power gated to the second module, and for a time when the power gated to the first module is above the first level, increasing the power gated to the second module.

In the shown example, the power gating controller controls the power gating elements so that, for the time while the power gated to the first module is below the first level, the sum of the power supplied to the second module plus any potential transient power spikes is insufficient to cause damage or malfunction to the second module.

In the shown example, the power gating controller controls the power gating elements so that, for the time while the power gated to the first module is below the first level, the power gated to the second module is ramped down to a second level.

In the shown examples, the power gating controller controls the power gating elements so that, for at least some of the time when the power gated to the first module is above the first level, the difference between the power gated to the first module and the power gated to the second module is less than a set value. The time during which the difference between the power gated to the first module and the power gated to the second module is less than the set value can e.g. maximised.

In the shown example, the integrated circuit further comprises at least one timer coupled to the power gating controller for timing from when the power gated to the first module is first started to ramp up, and the power gating controller controls the power gating elements so that the reduction in the power gated to the second module and the increase in the power gated to the second module occurs at set times from when the power gated to the first module is first started to ramp up. Additionally or alternatively, the integrated circuit can further comprise at least one power sensor coupled to the power gating controller for sensing the power gated to the first module, and the power gating controller controls the power gating elements so that at least one of the reduction in the power gated to the second module and the increase in the power gated to the second module is based on the sensed power.

In general, an integrated circuit 2 may have a large number of different functional modules thereon, each of which may have different power and operational requirements. Some of the functional modules may need to be powered on all the time, whereas others are only needed to be operational as needed and can be switched off the rest of the time in order to save power. In some cases, several modules, although having different functions, may always be needed, or not, at the same time, and therefore can be treated as a separate portion of the integrated circuit having a particular power requirement. Two such modules (or circuit portions) are shown in FIG. 1, where a first module 4 is one that may be off to save power, but is powered up when needed, and a second module 6 is, for these purposes, always on. As will be appreciated by a person skilled in the art, the module that is referred to an being always on, is not necessarily on at all times, but is on at all relevant times that the first module is powered up and powered down, so appears to be always on from the perspective of the first module. In fact, the second module may itself be one that is powered up and down and has a further module that is "always on" relative to it, in which case it can be treated as the first module in the description below.

Figure 2A:
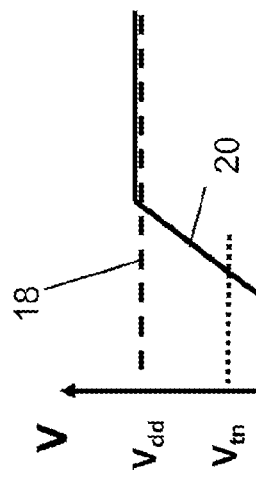
FIGS. 2 (a)-(c) schematically show graphs of voltage applied to two modules in an integrated circuit.

As mentioned above, FIG. 1, shows an integrated circuit 2 having two or more functional modules (or circuit portions) 4, 6. The first module 2 may be used less often than the second module 6, which would always be on from before the first module 4 is powered up until at least after the first module 4 is powered down. However, when the first module 4 is on and operational, it supplies one or more signals or data to the second module 6. Of course, such communication between the first and second modules may be two-way, as shown. Thus, as shown in FIG. 2(a), the power voltage 18 supplied to the second module 6 is, generally, at $V_{dd}$, whereas the voltage 20 supplied to the first module 4, ramps up from zero, or a very low value in the case that the module requires a low voltage supply in a "sleep" mode and cannot be completely switched off, up to the required power level, usually also $V_{dd}$. However, as the voltage supplied to the first module increases, there is a likelihood that, as the voltage increases to over about half the full voltage, as shown at voltage $V_{tn}$, current through the first module can cause transient signals to occur and voltage spikes to be propagated through to the second module. This can cause malfunction in the second module, particularly if the voltage and current spikes are high. By reducing the voltage supplied to the second module while the voltage supplied to the first module is in the danger zone, such that the sum of the current through the second module plus any potential current spikes is insufficient to cause damage or malfunction in the second module.

As shown in FIG. 1, a power management system may be provided in the integrated circuit 2 that includes a power management unit 8, a power gating controller, such as synchronization controller 10, a timer 12 and a plurality of power gating elements, such as voltage regulators 14, 15, 16 and 17. Voltage regulators 14 and 15 are coupled to full voltage supply $V_{DD}$ and voltage regulators 16 and 17 are coupled to a reduced level (Power Down) voltage $V_{PD}$. The power management unit 8 is used to determine when a particular module can be powered down to save power and when it should be powered up again. Thus, when it determines that, for example, the first module 4, which may be in a powered off state, should be powered up, a signal is sent to the synchronization controller 10 to request that the first module 4 be powered up. The synchronization controller 10 either already knows, or is told by the power management unit, that the second module 6, which is already powered on, is coupled to the first module 4, and therefore is in danger of having power spikes and/or transient signals from the first module on power up.

Figure 2B:
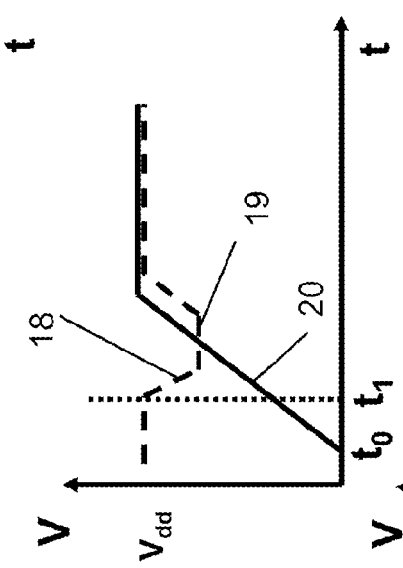

On receiving the request from the power management unit 8 for the first module 4 to be powered up, the synchronization controller 10 starts the timer 12 counting, as shown at time $t_0$ in FIG. 2(b) and also controls a voltage regulator 14 to start to ramp up the voltage 20 supplied to the first module 4 until it reaches the required supply voltage $V_{dd}$. The voltage regulator 14 is coupled to supply voltage $V_{DD}$ and ramps the voltage 20 supplied to the first module 4 at a predetermined rate, as shown in FIG. 2(b). When the voltage 20 supplied to the first module 4 from the voltage regulator 14 reaches a predetermined level, the synchronization controller 10 controls the voltage regulator 16 coupled to the second module 6 to start to power down the second module 6 towards the reduced level voltage $V_{pd}$. The start of the power down of the second module 6 is based on the count of timer 12, which can be arranged to count down from a particular known value at time $t_0$, if the ramp up of the voltage 20 supplied to the first module 4 is at a known rate, to end at time $t_1$ as shown in FIG. 2(b), whereupon the timer 12 provides an indication that the count has completed to the synchronization controller 10. Additionally or alternatively, the start up of the power down could be based on an output of a voltage sensor that is arranged to sense the level of the voltage supplied to the first module 4 from the voltage regulator 14. The ramping down of the voltage 18 supplied to the second module 6 may be controlled to occur for only a predetermined period of time, for example using the timer 12 (or another timer), or until it reaches a predetermined voltage level, so that the second module 6 is still supplied with sufficient power for it to function, albeit, perhaps, at a reduced frequency. For example, dynamic voltage and frequency changing may be used to reduce the voltage, and hence save power, when the frequency of a particular module does not have to be at its highest value. The power management unit will recognise when the second module can be operated at such a reduced frequency and will therefore request that the first module be powered up at this time, so that the overall operation of the circuit is not impaired.

The voltage 18 supplied by the voltage regulator 16 to the second module 6 may then be maintained at a predetermined reduced level 19 for a period of time, until the voltage 20 supplied to the first module 4 has ramped up to a level at which the transient signals and/or voltage spikes are no longer a risk. Thereafter the synchronization controller 10 controls the voltage regulator 15 coupled to the second module 6 to ramp the power up to the second module 6 towards the supply voltage level $V_{dd}$. The ramp up of the voltage to the second module 6 may track the ramp up of the voltage to the first module 4 and may be arranged to do so at substantially the same time, or to lead or lag (as shown in FIG. 2(b)) the voltage increase to the first module 4.

Figure 2C:
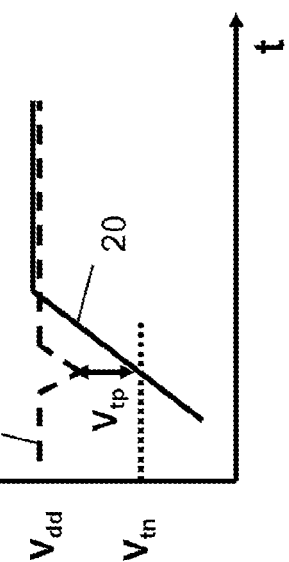

In some cases, depending on timing and other issues, it may not be necessary, or possible, to maintain the voltage 18 supplied to the second module 6 at the reduced level 19 for any substantial period of time. In this case, as shown in FIG. 2(c), the voltage 18 supplied to the second module 6 is firstly ramped down and then ramped back up again. The voltage difference between the voltage 18 supplied to the second module 6 and the voltage 20 supplied to the first module 4 may be maintained at, or less than, a predetermined value $V_{tp}$ once the voltage 20 supplied to the first module 4 is above $V_{tn}$. The time during which this condition is met can be maximised. However, if this condition cannot be met for all the time that voltage 20 supplied to the first module 4 is above $V_{tn}$, then the amount of time when it is not met can be minimized so far as possible.

Figure 3:
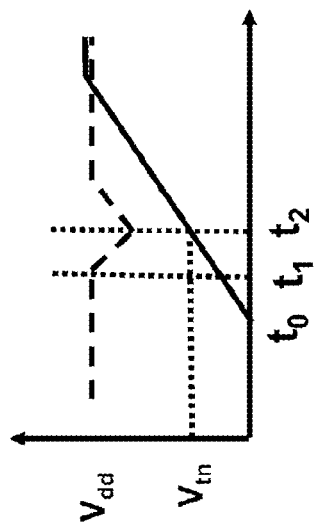
FIG. 3 schematically shows a graph of the timing of voltages applied to the two modules in an integrated circuit.

FIG. 3 shows how the timer 12 can be used if the rate of ramp up and down is known. In this case:

$$t_2 - t_0 = V_{tn}/K$$

and:

$$t_2 - t_1 = (V_{dd} - V_{tp} - V_{tn})/K$$

where K is the rate of voltage change. Thus, each of the times $t_1$ and $t_2$ can be determined and the timer can be set to count to these times. As mentioned above, an alternative or addition to using one or more timers 12 is to use voltage sensors to sense the voltage levels supplied to the first and second modules and to pass those levels to the synchronization controller 10, or at least to provide indications to the synchronization controller 10 when the predetermined voltage levels $V_{tp}$ and $V_{tn}$ are reached.

As will be apparent, when the first module 4 can be powered down, the power management unit 8 sends the request to the synchronization controller 10, which then controls the voltage regulator 17 to ramp down the voltage to the first module 4, In the foregoing specification, the invention has been described with reference to a specific example of an embodiment of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connection carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, although in the above described embodiment, the processor is described with two cores, it will be apparent that any number of cores could be present on the processor, for example, three, four, or more.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of power management of an integrated circuit, the integrated circuit comprising a plurality of independent functional modules, at least a first module being in a powered off state while a second module is in a powered on state, the second module being connected to the first module, and a plurality of power gating elements, each of said power gating elements being coupled between a respective functional module and a source of power for that functional module, the method comprising:
controlling the power gating elements to ramp up the power gated to the first module in order to power it up;
for a time while the power gated to the first module is below a first level, reducing the power gated to the second module; and
for a time when the power gated to the first module is above the first level, increasing the power gated to the second module.

2. A method of power management according to claim 1 further comprising controlling the power gating elements so that, for the time while the power gated to the first module is below the first level, the sum of the power supplied to the first and second modules is lower than potential transient power spikes.

3. A method of power management according to claim 1 further comprising controlling the power gating elements so that, for the time while the power gated to the first module is below the first level, the power gated to the second module is ramped down to a second level.

4. A method of power management according to claim 1 further comprising controlling, the power gating elements so that, for at least some of the time when the power gated to the first module is above the first level, the difference between the power gated to the first module and the power gated to the second module is less than a set value.

5. A method of power management according to claim 1, further comprising timing from when the power gated to the first module is first started to ramp up, and controlling the power gating elements so that the reduction in the power gated to the second module and the increase in the power gated to the second module occurs at set times from when the power gated to the first module is first started to ramp up.

6. A method of power management according to claim 1, further comprising sensing the power gated to the first module, and controlling the power gating elements so that at least one of the reduction in the power gated to the second module and the increase in the power gated to the second module is based on the sensed power.

7. An integrated circuit, comprising:
a plurality of functional modules, comprising at least one first module having a powered off state and a powered on state and at least one second module connected to the first module having a powered on state;
a plurality of power gating elements, each of said power gating elements being coupled between a respective functional module and a source of power for that functional module; and
a power gating controller coupled to the power gating elements, the power gating controller to control the power gating element and to:
ramp up power gated to the first module in order to power the first module up, when the first module is in a powered off state and the second module is in the powered on state;
reduce power gated to the second module, for a time while the power gated to the first module is being ramped up and is below a first level; and
increase the power gated to the second module, for a time while the power gated to the first module is being ramped up and is above the first level.

8. The integrated circuit according to claim 7, wherein the power gating controller is further arranged to control the power gating elements so that, for the time while the power gated to the first module is below the first level, the sum of the power supplied to the second module plus any potential transient power spikes is insufficient to cause damage or malfunction to the second module.

9. The integrated circuit according to claim 7, wherein the power gating controller is further arranged to control the power gating elements so that, for the time while the power gated to the first module is below the first level, the power gated to the second module is ramped down to a second level.

10. The An integrated circuit according to claim 7, wherein the power gating controller is further arranged to control the power gating elements so that, for at least some of the time when the power gated to the first module is above the first level, the difference between the power gated to the first module and the power gated to the second module is less than a set value.

11. An integrated circuit according to claim 7, further comprising:
at least one timer coupled to the power gating controller for timing from when the power gated to the first module is first started to ramp up, wherein
the power gating controller is arranged to control the power gating elements so that the reduction in the power gated to the second module and the increase in the power gated to the second module occurs at set times from when the power gated to the first module is first started to ramp up.

12. An integrated circuit according to claim 7, further comprising:
at least one power sensor coupled to the power gating controller for sensing the power gated to the first module, wherein
the power gating controller is arranged to control the power gating elements so that at least one of the reduction in the power gated to the second module and the increase in the power gated to the second module is based on the sensed power.

13. A method of power management of an integrated circuit, the method comprising:
controlling a first voltage regulator to ramp up voltage provided to a first module of the integrated circuit to power up the first module;
for a time while the voltage provided to the first module is being ramped up and is below a first voltage level, controlling a second voltage regulator to reduce a voltage provided to a second module of the integrated circuit, wherein the second module is powered on, and the second module is connected to the first module; and
for a time while the voltage provided to the first module is being ramped up and is above the first level, controlling the second voltage regulator to increase the voltage provided to the second module.

14. The method of claim 13 further comprising:
controlling the first and second voltage regulators, for at least some of the time while the voltage provided to the first module is being ramped up and is below the first level, to cause a sum of the voltages provided to the first and second modules to be lower than potential transient voltage spikes.

15. The method of claim 13 further comprising:
controlling the second voltage regulator, for at least some of the time while the voltage provided to the first module is being ramped up and is below the first level, to ramp down the voltage provided to the second module to a predetermined level.

16. The method of claim 13 further comprising:
controlling the first and second voltage regulators, for at least some of the time while the voltage provided to the first module is being ramped up and is above the first level, to cause a difference between the voltage provided to the first module and the voltage provided to the second module to be less than a set value.

17. The method of claim 13, further comprising:
starting a timer in response to when the voltage provided to the first module is first started to ramp up the first voltage regulator;
controlling the second voltage regulator to reduce the voltage provided to the second module at a first time period from when the voltage provided to the first module is first started to ramp up; and
controlling the second voltage regulator to increase the voltage provided to the second module at a second time period from when the voltage provided to the first module is first started to ramp up.

18. The method of claim 13, further comprising:
sensing the voltage provided to the first module; and
controlling the second voltage regulator to base one of the reduction in the voltage provided to the second module and the increase in the voltage provided to the second module on the sensed voltage.

19. The method of claim 13, wherein the first voltage regulator is coupled between the first module and a first supply voltage.

20. The method of claim 13, wherein the second voltage regulator is coupled between the second module and a second supply voltage.

* * * * *